(12) United States Patent
Cochran et al.

(10) Patent No.: US 7,185,246 B2
(45) Date of Patent: Feb. 27, 2007

(54) MONITORING OF SOLID STATE MEMORY DEVICES IN ACTIVE MEMORY SYSTEM UTILIZING REDUNDANT DEVICES

(75) Inventors: William Hugh Cochran, Rochester, MN (US); William Paul Hovis, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 230 days.

(21) Appl. No.: 11/013,150

(22) Filed: Dec. 15, 2004

(65) Prior Publication Data

US 2006/0129899 A1 Jun. 15, 2006

(51) Int. Cl.
*G11C 29/00* (2006.01)
(52) U.S. Cl. ......................... 714/718; 714/42
(58) Field of Classification Search .................. 710/20; 714/32, 719, 718, 42; 365/200, 233
See application file for complete search history.

(56) References Cited

U.S. PATENT DOCUMENTS

| | | | | |
|---|---|---|---|---|
| 5,159,671 A | * | 10/1992 | Iwami | ......................... 710/20 |
| 5,475,815 A | * | 12/1995 | Byers et al. | ................... 714/32 |
| 5,835,703 A | * | 11/1998 | Konno | ........................ 714/42 |
| 6,285,605 B1 | * | 9/2001 | Schrogmeier et al. | ....... 365/200 |
| 7,099,233 B2 | * | 8/2006 | Chen | ........................ 365/233 |

* cited by examiner

*Primary Examiner*—David Ton
(74) *Attorney, Agent, or Firm*—Wood, Heron, Evans, L.L.P.

(57) ABSTRACT

Redundant capacity in a memory system is utilized to facilitate active monitoring of solid state memory devices in the memory system. All or part of the data stored in an active solid state memory device, and used in an active data processing system, may be copied to at least one redundant memory device, e.g., by transitioning a memory address range that was allocated to the active memory device to the redundant memory device. By doing so, memory access requests for the memory address range, which would normally be directed to the active memory device, may instead be directed to the redundant memory device, thus enabling the active memory device to be tested (e.g., via writing and reading test data patterns to the active memory device) without interrupting system access to that memory address range.

27 Claims, 6 Drawing Sheets

MONITORING OF SOLID STATE MEMORY DEVICES IN ACTIVE MEMORY SYSTEM UTILIZING REDUNDANT DEVICES

FIELD OF THE INVENTION

The invention relates to computers and data processing systems, and in particular to testing solid state memory devices utilized in such computers and data processing systems.

BACKGROUND OF THE INVENTION

Ensuring the integrity of data processed by a data processing system such as a computer or like electronic device is critical for the reliable operation of such a system. Data integrity is of particular concern, for example, in fault tolerant applications such as servers, databases, scientific computers, and the like, where any errors whatsoever could jeopardize the accuracy of complex operations and/or cause system crashes that affect large numbers of users. In many of such applications, system availability is of paramount importance, and as such, the ability to detect and/or correct potential failures in a system is a highly desirable feature.

Data integrity issues are a concern, for example, for many solid state memory arrays such as those used as the main working storage repository for a data processing system. Solid state memory arrays are typically implemented using multiple integrated circuit memory devices or chips such as static or dynamic random access memory (SRAM or DRAM) devices, and are controlled via memory controllers typically disposed on separate integrated circuit devices and coupled thereto via a memory bus. Solid state memory arrays may also be used in embedded applications, e.g., as cache memories or buffers on logic circuitry such as a processor chip.

It has been found, for example, that solid state memory devices are often susceptible to adverse temperature effects, leading to issues such as lost bits, poor timing characteristics, increased noise, and decreased performance. While some of these issues may result in the generation of errors that are potentially correctable without any loss of data, in some instances temperature effects or other adverse conditions may lead to higher error rates, and thus a greater risk of encountering a non-recoverable error. Furthermore, with the increased power levels seen in higher performance systems, as well as the typical focus on controlling the operating temperature of the processor chips in a system, it has been found that many memory devices are required to operate at or above recommended temperature limits. Furthermore, in many instances these effects may be dependent upon the physical location of a device and the airflow characteristics of the system enclosure, and the temperature effects experienced by one device may differ from other devices in the same system.

A significant amount of effort has been directed toward detecting and correcting errors in memory devices during power up of a data processing system, as well as during the normal operation of such a system. It is desirable, for example, to enable a data processing system to, whenever possible, detect and correct any errors automatically, without requiring a system administrator or other user to manually perform any repairs. It is also desirable for any such corrections to be performed in such a fashion that the system remains up and running. Often such characteristics are expensive and only available on complex, high performance data processing systems. Furthermore, in many instances, many types of errors go beyond the ability of a conventional system to do anything other than "crash" and require a physical repair before normal device operation can be restored.

Conventional error detection and correction mechanisms for solid state memory devices typically rely on parity bits or checksums to detect inconsistencies in data as it is retrieved from memory. Furthermore, through the use of Error Correcting Codes (ECC's) or other correction algorithms, it is possible to correct some errors, e.g., single-bit errors up to single-device errors, and recreate the proper data. Another capability supported in some systems is referred to as "memory scrubbing," where a background process periodically reads each location in a memory array and utilizes ECC circuitry to detect and (if possible) correct any errors in the array. In large memory systems, however, background scrubbing can take hours or days to make a complete pass through the memory space; otherwise, faster scrubbing may be used, albeit with reduced system performance due to the need to allocate a portion of the available memory bandwidth to scrub operations.

In addition, some conventional correction mechanisms for solid state arrays may be capable of disabling defective devices or utilizing redundant capacity within a memory system to isolate errors and permit continued operation of a data processing system. For example, steering may be used to effectively swap out a defective memory device with a spare memory device. Of note, however, is the fact that redundant devices are not used unless a failure is detected in another device. Furthermore, even when a redundant device is used, the use may only be temporary, until the failed device (or card upon which the device is mounted) is replaced. As a result, redundant devices add to the overall cost of a system, while remaining idle a vast majority of the time.

While existing error detection and correction mechanisms provide increased reliability, a need still exists for enhancing the ability of a data processing system to monitor the health of its memory system, and correct any errors or potential errors with little or no impact on system performance and availability. Furthermore, a significant need also exists for expanding the monitoring capability of a data processing system in a manner that is cost efficient and that requires minimal modification and minimal impact on system performance.

SUMMARY OF THE INVENTION

The invention addresses these and other problems associated with the prior art by utilizing redundant capacity in a memory system to facilitate active monitoring of solid state memory devices in the memory system. Specifically, consistent with the invention, all or part of the data stored in an active solid state memory device, and used in an active data processing system, may be copied to at least one redundant memory device, e.g., by transitioning a memory address range that was allocated to the active memory device to the redundant memory device. By doing so, memory access requests for the memory address range, which would normally be directed to the active memory device, may instead be directed to the redundant memory device, thus enabling the active memory device to be tested (e.g., via writing and reading test data patterns to the active memory device) without interrupting system access to that memory address range.

Therefore, consistent with the invention, a solid state memory device may be tested by dynamically transitioning a memory address range allocated to an active solid state memory device from the active solid state memory device to a redundant solid state memory device such that memory accesses associated with the memory address range are directed to the redundant solid state memory device, and testing the active solid state memory device while memory accesses associated with the memory address range are directed to the redundant solid state memory device.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

The embodiments discussed and illustrated hereinafter essentially utilize redundant memory devices in a solid state memory system to temporarily replace active memory devices for the purpose of testing the active memory devices without interrupting system access to the memory address ranges allocated to such active memory devices. Among other benefits, such a technique enables active monitoring to be performed on the various memory devices in an operational memory system, including (if desired) data bits, check bits and/or redundant bits in the system.

An active memory device is effectively replaced through dynamically transitioning all or part of the memory address range allocated to that active memory device to a redundant memory device. When dynamically transitioned, memory access requests directed to memory addresses within a transitioned memory address range will be redirected to the redundant memory device. Moreover, typically any data stored in an active memory device and addressed at a transitioned memory address range is copied or moved from the active memory device to the redundant memory device in connection with the dynamic transition. In some embodiments, e.g., where an active memory device contributes one, two or some other subset of bits in a given word of data addressed at a particular memory address, the transition of a memory address range from an active memory device to a redundant memory device is typically specific only to that active memory device, as the comparable memory address range for other active memory devices may not be similarly transitioned at the same time.

Figure 1:
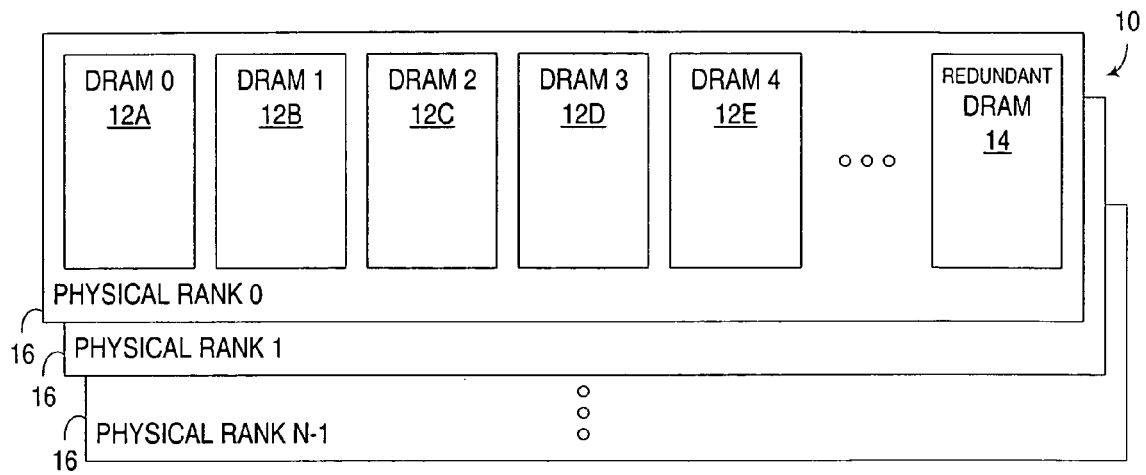
FIG. 1 is a block diagram of an exemplary memory architecture incorporating redundant memory devices.
Figure 2:
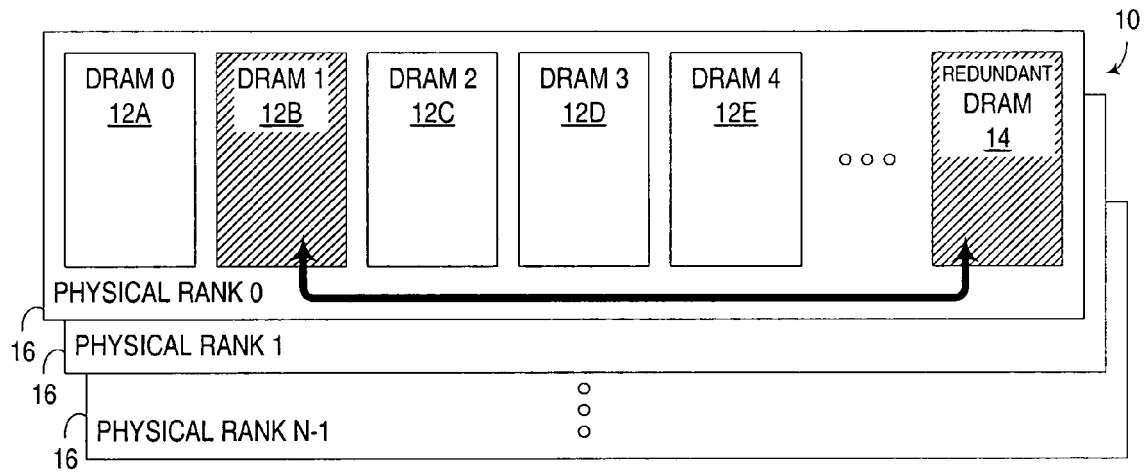
FIG. 2 is a block diagram of the memory architecture of FIG. 1, illustrating the dynamic transition of the entire memory address range allocated to an active memory storage device to a redundant memory device for use in connection with active monitoring in a manner consistent with the invention.
Figure 3:
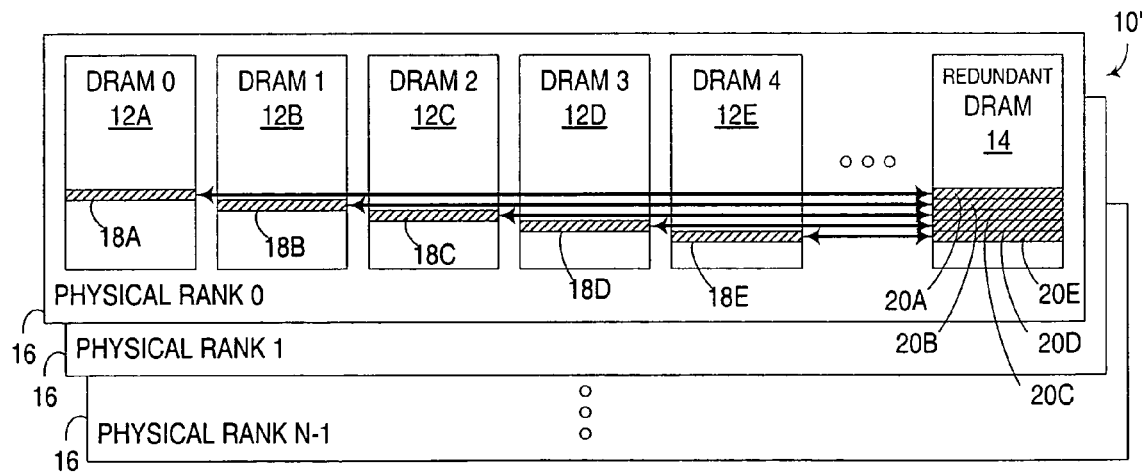
FIG. 3 is a block diagram of the memory architecture of FIG. 1, illustrating the dynamic transition of portions of memory address ranges allocated to a plurality of active memory storage devices to a redundant memory device for use in connection with active monitoring in a manner consistent with the invention.

Turning to the Drawings, wherein like numbers denote like parts throughout the several views, FIGS. 1–3 illustrate the concept of dynamically transitioning memory address ranges associated with active memory devices to redundant memory devices to facilitate active monitoring. FIG. 1, in particular, illustrates an exemplary memory system 10 incorporating a plurality of active memory devices, here implemented as Dynamic Random Access Memories (DRAM's) 12A–12E with which is associated a single redundant DRAM 14. DRAM's 12A–12E and 14 are illustrated as being logically arranged in a single block or physical rank 16, and it will be appreciated that a memory system may incorporate multiple blocks or physical ranks of memory devices, as illustrated in FIG. 1.

In one embodiment consistent with the invention, each active memory device may be individually replaced by, or swapped with, a redundant memory device, such that the entire memory address range allocated to the active memory device is dynamically transitioned to the redundant memory device. Typically, the dynamic transition further requires that the system data stored in the active memory device be copied to the redundant memory device. FIG. 2, for example, illustrates DRAM 12B being replaced by redundant DRAM 14.

Once or while being replaced, the active memory device may be loaded with test patterns and checked for absolute data integrity. Then, when the check-out of a given active memory device is complete, the system data originally stored in the active memory device, and now stored in the redundant memory device (which may also have been modified via write operations occurring after the dynamic transition), may then be copied back into the active memory device, enabling the process to be repeated for another active memory device. In this embodiment, this process may be permitted to run continuously so long as the redundant memory device is not required to replace a defective memory device. The redundant memory device can also itself be checked out in a similar manner. In addition, if at any time an error occurs where redundancy is required, the system data stored in a redundant memory may need to be copied back to the active memory device, with conventional redundant bit steering (RBS) used to replace the defective memory device.

The manner in which an active memory device is replaced by, or logically swapped with, a redundant memory device, can vary in different embodiments. For example, the logical swap may be performed in the manner as if the active memory device were determined to be defective. The logical swap may be performed, for example, using normal scrub operations, or with fast scrubs, which move the data more quickly. Once or while the data has been moved and all real reads and writes are directed to the redundant memory device, any data pattern desired can be stored to and read from the real DRAM. In some embodiments, it is desirable for these store and fetch (write and read) operations to essentially be implemented using the normal data traffic that takes place within the system, including scrub commands. In other embodiments, however, additional commands specific to writing or reading to or from the device under test, may be added to the normal traffic flow as desired (from very infrequently to some higher percentage of the bus traffic). This additional traffic may be programmable in nature, and may also be dependent on bus availability (e.g., only perform such operations if activity levels are low, etc.). In most embodiments, the active memory devices will typically be accessed in parallel so any scrub or monitor commands typically should be performed with a read modify write sequence so that the real data can be moved to the desired location or updated in its current location and the monitor bits updated appropriately. Once a device has been tested for a period of time, the real data can be moved back to the real device from the redundant memory device in a similar manner. Where data pattern sensitivities are detected, or where a particular DRAM is found to be experiencing difficulties (e.g., due to high temperature, power supply noise, clock noise, or some other type of degradation), these tests can be used to isolate the problem and preventively perform a repair.

In an alternate embodiment, rather than transitioning entire memory address ranges allocated to individual active memory devices, multiple active memory devices may be tested concurrently by replacing a subset of the total memory address ranges allocated to multiple such devices with comparable storage areas in a redundant memory device. For example, in one embodiment, different memory address ranges for different active memory devices may be mapped to corresponding memory address ranges in a redundant memory device, so that the redundant memory device stores system data from each active memory device. In order to eventually check all memory address ranges in all of the memory devices in a system, it may be desirable to provide multiple mappings such that after a given set of memory address ranges has been tested, different sets of memory address ranges are then swapped in to the redundant device and tested, until all of the active memory devices have been fully tested.

FIG. 3, for example, illustrates an alternate memory architecture 10' whereby different memory address ranges 18A–18E in DRAM's 12A–12E are mapped to corresponding memory address ranges 20A–20E in redundant DRAM 14. A benefit of the embodiment of FIG. 3, would be that every active DRAM in a block or rank may be monitored virtually at the same time. Given that many system level issues typically affect an entire memory device, this alternative configuration may be able to isolate such issues more quickly as testing operations would concurrently "touch" some portion of all of the memory devices.

It will be appreciated that the sizes and locations of the memory address ranges mapped between active memory devices and a redundant memory device can vary from device to device, and moreover, that a memory address range in an active memory device may be mapped to a different address range in a redundant memory device (i.e., the row/column/bank addressing may be different).

It will also be appreciated that multiple redundant memory devices may be utilized for a given rank or block of memory, and that redundant memory devices may be made available on a system-wide basis, a rank or block basis, or on any other logical partitioning of a memory system or subsystem. In addition, while the implementations discussed herein focus on a main storage implemented using DRAM memory devices, the invention may also be utilized in connection with other volatile or non-volatile solid state memory devices, including other main storage devices, cache memories, embedded memory arrays, SRAM memory arrays, flash memory arrays, etc.

Moreover, as will become more apparent below, it will be appreciated that the dynamic transition of a memory address range between an active memory device and a redundant memory device, and the associated copying of data between the devices, need not occur in a single discrete operation. In particular, in one embodiment discussed in greater detail below, dynamic transitioning may occur as a background-type process, e.g., in connection with a memory scrub operation, whereby the dynamic transition may occur in a piecemeal fashion as the scrub proceeds through a memory address range. As such, in some embodiments the loading and checking of test patterns in an active memory device may begin prior to completing a dynamic transitioning of a memory address range from the active memory device to a redundant memory device.

It will also be appreciated that, depending upon the particular memory architecture at issue, dynamic transitioning of a memory address range between an active memory device and a redundant memory device may result in the transition of all of the bits in a given word of data stored at a given memory address being copied to the redundant memory device, or more typically, only a subset of bits (e.g., one bit), similar in many respects to the manner in which redundant memory devices are utilized in connection with redundant bit steering. In the embodiments of FIGS. 1–3, for example, each active DRAM 12A–12E may contribute a single bit to each memory address, or possibly 4, 8 or 16 bits for 4×, 8× or 16× DRAM implementations.

It should furthermore be appreciated that, typically once a redundant memory device is being used to repair a defect, the redundant memory device will no longer be available for use in connection with active monitoring. However, in many embodiments, techniques such as intelligent bit mapping may enable a number of errors to be repaired without steering in an entire redundant memory device, and as such, it may be possible to still utilize a remaining unused portion of a redundant device for active monitoring.

As yet another alternative, rather than dynamically transitioning a memory address range from a first active memory device to a redundant memory device, and then back to the first active memory device before transitioning from a second active memory device to the redundant memory device, some embodiments may rely on redundancy that can be moved from memory device to memory device. In such embodiments, for example, a dynamic transition may occur from a first active memory device to a second memory device functioning as a redundant memory device to test the first active memory device. Once the testing is complete, a dynamic transition may then occur from the second memory device to a third memory device during testing of the second memory device. In this manner, the memory device that is analogous to a redundant memory device effectively changes after each memory device has been tested.

In other embodiments consistent with the invention, the monitor space (made possible by the redundant memory device) may be used to represent real system data in some other fashion, e.g., to store duplicate data that needs to remain secure (like operating system code that doesn't update, boot code, etc.). For example, it may be desirable to protect boot code, key elements of the operating system, critical cache lines, etc., by retaining this data in the redundant device and swapping it with active memory devices during monitoring. Once redundancy was required, the system would typically be able to continue to run with this capability removed, but in a degraded support mode until the defective memory device is replaced.

Other alternatives will be apparent to one of ordinary skill in the art having the benefit of the instant disclosure.

Exemplary Hardware Environment

Figure 4:
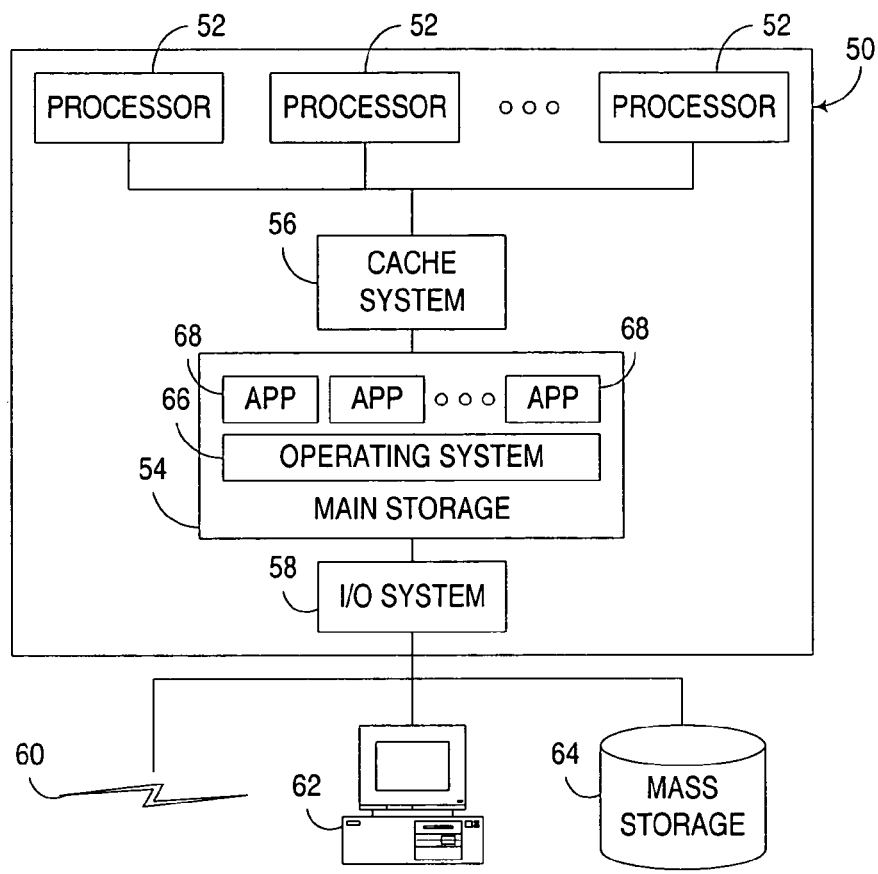
FIG. 4 is a block diagram of an exemplary apparatus with a memory architecture supporting active monitoring consistent with the invention.

FIG. 4 next illustrates a computer 50 that represents one suitable environment within which active monitoring consistent with the invention may be implemented. Computer 50 generically represents, for example, any of a number of multi-user computers such as a network server, a midrange computer, a mainframe computer, etc. However, it should be appreciated that the invention may be implemented in practically any device capable of utilizing solid state memory devices, including other computers and data processing systems, e.g., in single-user computers such as workstations, desktop computers, portable computers, and the like, or in other programmable electronic devices (e.g., incorporating embedded controllers and the like), such as set top boxes, game machines, etc.

Computer 50 generally includes one or more processors 52 coupled to a main storage 54 through one or more levels of cache memory disposed within a cache system 56. In some embodiments each processor 52 may include multiple processing cores. Furthermore, main storage 54 is coupled to a number of types of external devices via a system input/output (I/O) system 58, e.g., one or more networks 60, one or more workstations 62 and one or more mass storage devices 64. Any number of alternate computer architectures may be used in the alternative.

Also shown resident in main storage 54 is a typical software configuration for computer 50, including an operating system 66 (which may include various components such as kernels, device drivers, runtime libraries, etc.) accessible by one or more applications 68.

Computer 50, or any subset of components therein, may also be referred to hereinafter as an "apparatus". It should be recognized that the term "apparatus" may be considered to incorporate various data processing systems such as computers and other electronic devices, as well as various components within such systems, including individual integrated circuit devices or combinations thereof. Moreover, within an apparatus may be incorporated one or more logic circuit arrangements, typically implemented on one or more integrated circuit devices, and optionally including additional discrete components interfaced therewith.

It should also be recognized that circuit arrangements are typically designed and fabricated at least in part using one or more computer data files, referred to herein as hardware definition programs, that define the layout of the circuit arrangements on integrated circuit devices. The programs are typically generated in a known manner by a design tool and are subsequently used during manufacturing to create the layout masks that define the circuit arrangements applied to a semiconductor wafer. Typically, the programs are provided in a predefined format using a hardware definition language (HDL) such as VHDL, Verilog, EDIF, etc. Thus, while the invention has and hereinafter will be described in the context of circuit arrangements implemented in fully functioning integrated circuit devices, those skilled in the art will appreciate that circuit arrangements consistent with the invention are capable of being distributed as program products in a variety of forms, and that the invention applies equally regardless of the particular type of computer readable signal bearing media used to actually carry out the distribution. Examples of computer readable signal bearing media include but are not limited to recordable type media such as volatile and non-volatile memory devices, floppy disks, hard disk drives, CD-ROM's, and DVD's, among others, and transmission type media such as digital and analog communications links.

Figure 5:
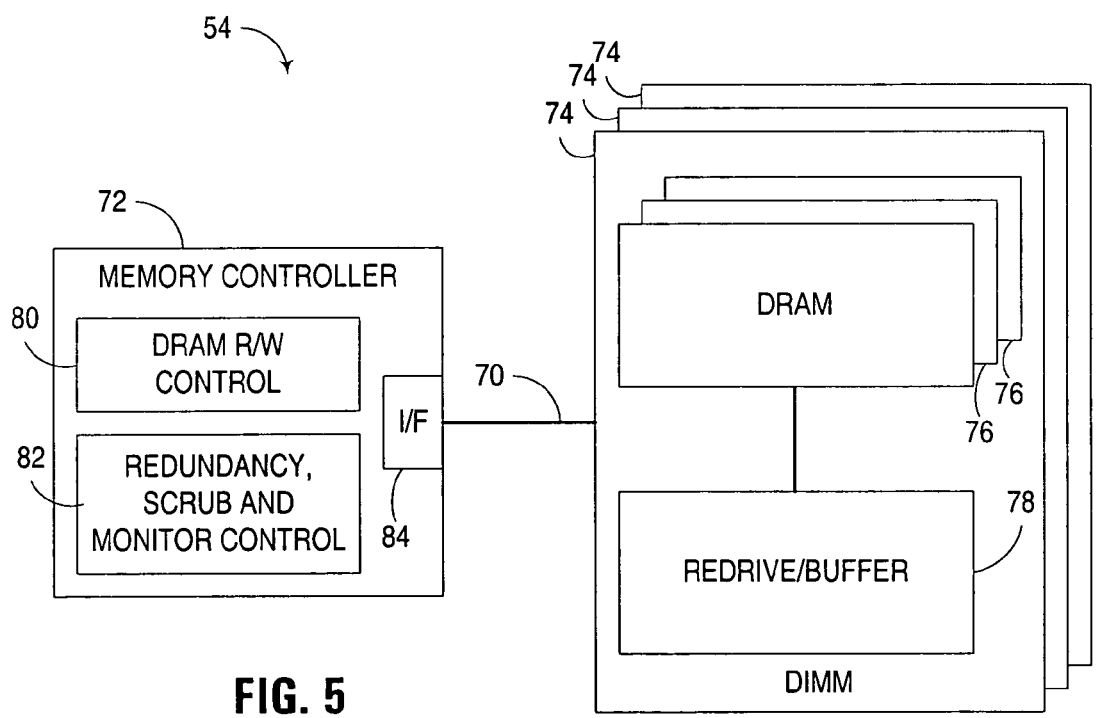
FIG. 5 is a block diagram an exemplary implementation of a main storage memory architecture in the apparatus of FIG. 4.

FIG. 5 next illustrates an exemplary memory architecture for main storage 54, including a memory bus 70 coupling together a memory controller 72 with a plurality of memory modules (e.g., Dual Inline Memory Modules, or DIMM's) 74. Each memory module 74 is typically implemented using a printed circuit board or card upon which is disposed a plurality of dynamic random access memory (DRAM) memory devices 76, and optionally additional interface circuitry, such as a redrive/buffer device 78.

For example, in an SDRAM environment, e.g., a DDR2 SDRAM environment, each memory module may be coupled in parallel to memory bus 70, and may include a redrive device that redrives the address and control lines from memory bus 70 to each memory device, leaving the data lines coupled directly to memory bus 70.

As another example, in a fully buffered DIMM (FB-DIMM) environment, memory modules 74 may be coupled to one another in a daisy chain arrangement, and each memory module may incorporate an Advanced Memory Buffer (AMB) device suitable for redriving the data, address and control lines from the memory bus to each memory device, as well as to drive subsequent FB-DIMM memory modules in the daisy chain arrangement consistent with the FB-DIMM specification.

Memory controller 72 may be a dedicated device, or alternatively, may be incorporated into a composite device, e.g., including one or more embedded caches and/or one or more cache controllers used to drive an external cache. Memory controller 72 may also be combined with other "chipset"-related components, e.g., system I/O components, PCI interface components, etc. Furthermore, memory controller 72 may be embedded in a processor device in some implementations. Furthermore, in some implementations a memory device may be an embedded array that is integrated onto the same integrated circuit as a memory controller, processor or other logic device.

It will be appreciated that practically any memory architecture may be utilized in connection with the invention. Moreover, it will be appreciated that monitoring may be implemented at different levels in a memory hierarchy, and may be implemented system wide or only on a subsystem-by-subsystem basis. As such, the invention is not limited to the particular memory architectures described specifically herein.

With respect to the active monitoring functionality described herein, memory controller 72 incorporates a read/write control block 80 and a redundancy, scrub and monitor control block 82, each of which being coupled to a memory interface 84 that interfaces the memory controller with memory bus 70. Block 80 principally handles normal read and write data traffic over memory bus 70, but implements additional circuitry to support active monitoring, as will be described in greater detail below. Block 82 may incorporate conventional redundant steering and scrubbing functionality, as well as additional functionality utilized to support active monitoring as described hereinafter. In other embodiments, active monitoring functionality may be implemented in a redrive/buffer device, a memory device, or in another component in a memory system, in addition to or in lieu of in a memory controller.

Exemplary Implementation of Active Monitoring

FIGS. 6, 7 and 8A–8D next illustrate one suitable implementation of active monitoring in computer 50 of FIGS. 4–5. In this exemplary implementation, it is assumed that the main memory is partitioned into N blocks or physical ranks (0 to N−1), and that each rank has X memory addresses or locations (0 to X−1, where X can be the same for each rank, but doesn't have to be), and that each rank is Y data bits wide (0 to Y−1) with 1 redundant bit. Each bit located at a particular memory address or location in a rank stored in a separate DRAM, thus resulting in Y active DRAM's and 1 redundant DRAM in each rank.

The active monitoring function relies on routing read and write requests to appropriate DRAM's in each rank. In addition, steering is used to effectively designate one bit in a word addressed at a particular memory address in a rank as a "monitor bit". When no active DRAM in a rank is being tested, the monitor bit is simply the redundant bit throughout the memory address range of the rank. However, when a particular memory address range for an active DRAM in a rank is being tested, each bit in the memory address range for the active DRAM becomes the monitor bit, and the corresponding bit in the redundant device is used to store the real data normally stored by the active DRAM. As will become more apparent below, bit steering techniques are used in connection with reading and writing test data, and otherwise handling normal or regular data traffic, to appropriately route data to and from the appropriate DRAM's in a rank whenever an active DRAM is being tested, which is conceptually similar to the manner in which a redundant DRAM is logically swapped with a defective DRAM.

Test data is written to a monitor bit using one or more deterministic data patterns, e.g., fixed patterns (all 0's, 1's), checker board patterns (010101 or 101010), diagonal 1's in a sea of 0's, diagonal 0's in a sea of 1's, or any other pattern capable of being deterministically calculated for a given memory location (e.g., using any combination of address, rank, data position, etc.). Typically, it is desirable to support multiple data patterns to ensure that different types of errors can be detected. As such, the embodiment described herein utilizes Z (0 to Z−1) unique data patterns for the monitor function.

For the purposes of this exemplary embodiment, a monitor bit (MBIT) indicator is defined to describe both the position and associated test data pattern for a monitor bit at any given location in memory. Four values are defined for an MBIT indicator. MBIT_RANK defines the rank for a given MBIT, and MBIT_ADDR defines the address for the MBIT within the rank.

MBIT_POS defines the data position for an MBIT in a given address and rank, i.e., which of the Y+1 bits (Y active bits and 1 redundant bit) is currently serving as the monitor bit for that unique location. Effectively, this value defines the manner in which memory address ranges in one or more active DRAM's are effectively transitioned to the redundant DRAM. For example, one data position may be allocated to the default condition where no swapping occurs, i.e., where the redundant bit is the monitor bit throughout an entire rank. Where entire active DRAM's are swapped with the redundant DRAM for testing (e.g., as illustrated in FIG. 2), different data position values may assign the monitor bit to selected active DRAM's throughout a rank. Otherwise, where slices or subsets of memory address ranges from each active DRAM are swapped with a redundant DRAM (e.g., as illustrated in FIG. 3), different data position values may assign the monitor bit to selected active DRAM's for different ranges of memory addresses (e.g., for one data position, assign the monitor bit for addresses 0–8191 to DRAM 0, assign the monitor bit for addresses 8192–16383 to DRAM 1, etc., and for another data position, assign the monitor bit for addresses 0–8191 to DRAM 1, assign the monitor bit for addresses 8192–16383 to DRAM 0, etc.)

MBIT_PATTERN defines the data pattern to be applied for the monitor bit, which when optionally combined with the MBIT_RANK, MBIT_ADDR and/or MBIT_POS values, can be used to deterministically derive the expected value of the monitor bit. As noted above, different MBIT_PATTERN values may be assigned to various data patterns such as fixed patterns, checker board patterns, diagonal patterns, etc.

Figure 6:
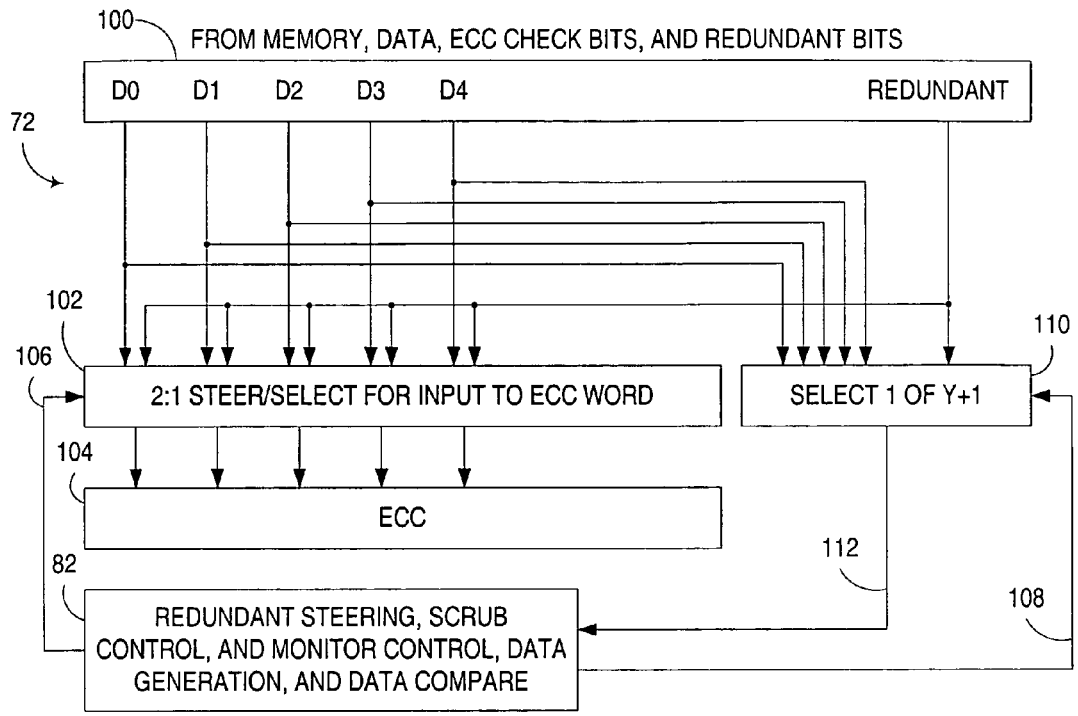
FIG. 6 is a block diagram of one exemplary implementation of the read data path utilized in the memory architecture of FIG. 5.
Figure 7:
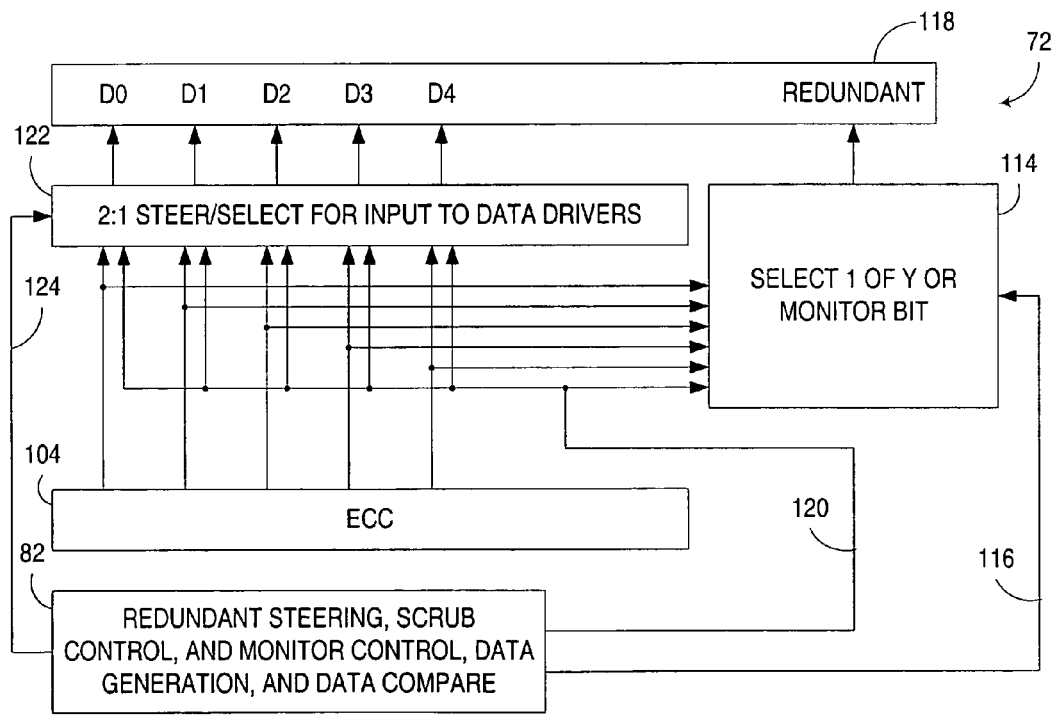
FIG. 7 is a block diagram of one exemplary implementation of the write data path utilized in the memory architecture of FIG. 5.

To support the dynamic transitioning of memory address ranges between active and redundant DRAM's, the read and write data paths of memory controller 72 are implemented as shown in FIGS. 6 and 7, respectively. Referring to FIG. 6, the read data path receives from memory bus the Y data bits D0 to D(Y−1) (data bits D0–D4 only being shown in FIG. 6), as well as the redundant bit, as represented by block 100. As with many conventional designs, the data bits are supplied to one set of inputs for a 2:1 steer/select block 102 that outputs to an ECC block 104. The redundant bit is supplied to each bit line for the other set of inputs to block 102. Block. 82, which supports conventional redundant steering and scrub functionality, outputs a select signal 106 to block 102 to effectively substitute the redundant bit for any of the data bits as required.

To support additional monitor functionality, block 82 incorporates additional functionality above and beyond conventional redundant steering and scrub functionality. Within this additional functionality is the capability to output a monitor bit control signal 108 to a select 1 of Y+1 block 110 that is added to the read data path, and that receives as input the Y data bits and the redundant bit. Based upon signal 108, block 110 routes one of these bits to block 82 as monitor bit signal 112. By doing so, the monitor bit can be read and routed to block 82 to verify a bit from a data pattern that was previously written to the monitor bit was properly stored and retrieved.

Referring to FIG. 7, the write data path of memory controller 72, similar to many conventional designs, utilizes a select block 114, which receives as input each of the data bits output by ECC block 104. Select block 114 is controlled by a select signal 116 generated by block 82 to selectively output one of the input bits to the memory bus as the redundant bit, as represented at block 118. Unlike conventional designs, however, select block 114 is additionally configured to receive a monitor bit as an additional input, which is supplied by block 82 via a monitor bit signal 120. Select block 114 therefore has Y+1 inputs, and is capable of routing a monitor bit to the redundant device as desired.

To route the monitor bit to any other data bit, the write data path also includes an additional block, a 2:1 steer/select block 122, which is interposed between ECC block 104 and the drivers for the memory bus. One set of inputs for block 122 receives the data to be written to memory by ECC block 104, while the monitor bit is supplied to the other set of inputs via monitor bit signal 120. A select signal 124 is output by block 82 to control block 122 to effectively route the monitor bit to any of the data bits.

Now turning to FIGS. 8A–8D, an exemplary flow chart is illustrated for performing active monitoring in the exemplary embodiment. The embodiment relies on scrub commands similar to those utilized in conventional designs, which conventionally proceed through all addresses in each rank of memory, reading the data stored at each address and performing any ECC correction as necessary, and writing back the correct data and potentially logging the error and/or invoking repair functionality, if ECC correction detects an error. In embodiments where scrub commands are not supported, it may be desirable to utilize dedicated monitor commands in the alternative.

Figure 8A:
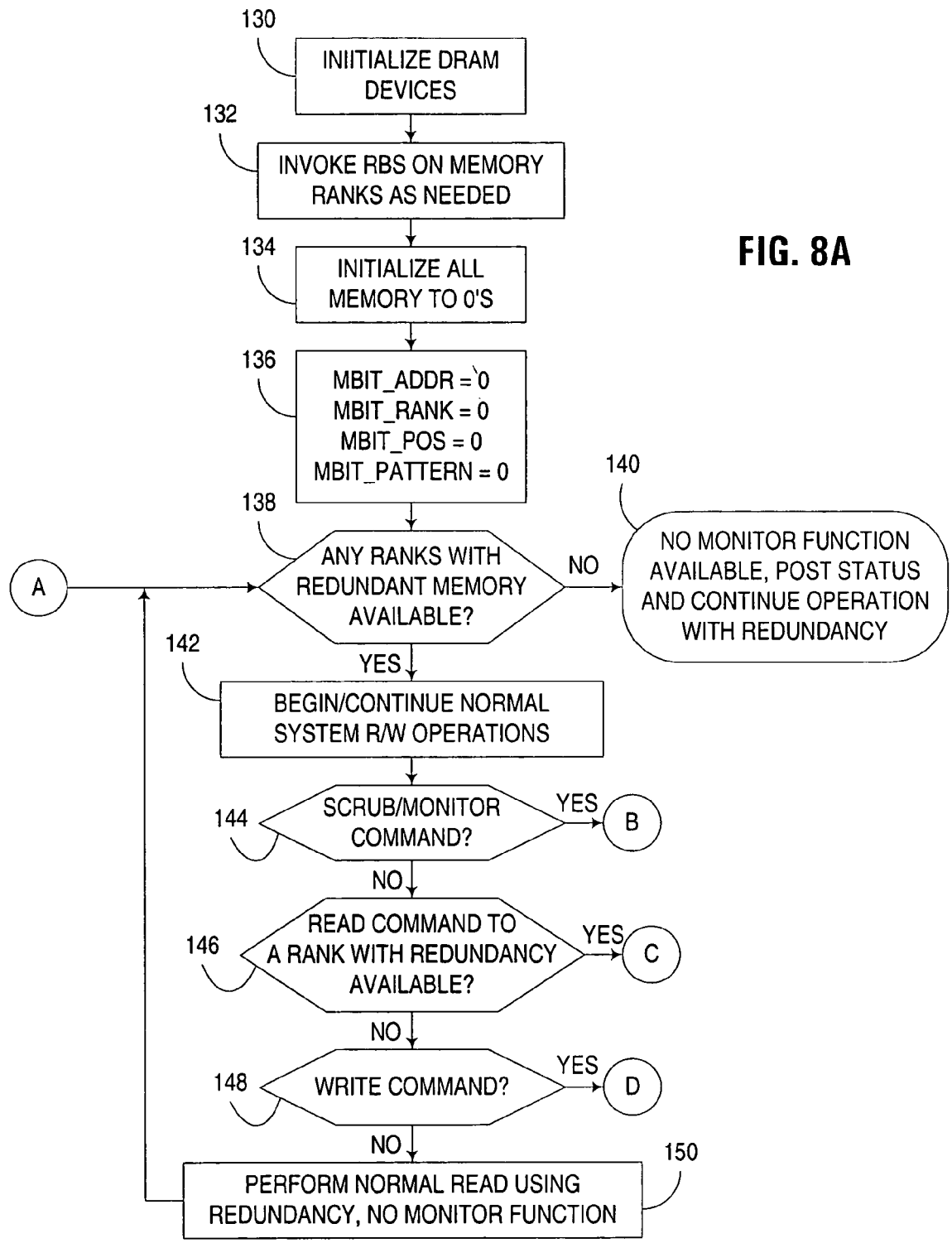
FIGS. 8A–8D illustrate a flowchart of an exemplary sequence of steps utilized in performing active monitoring in the memory architecture of FIG. 5.
Figure 8B:
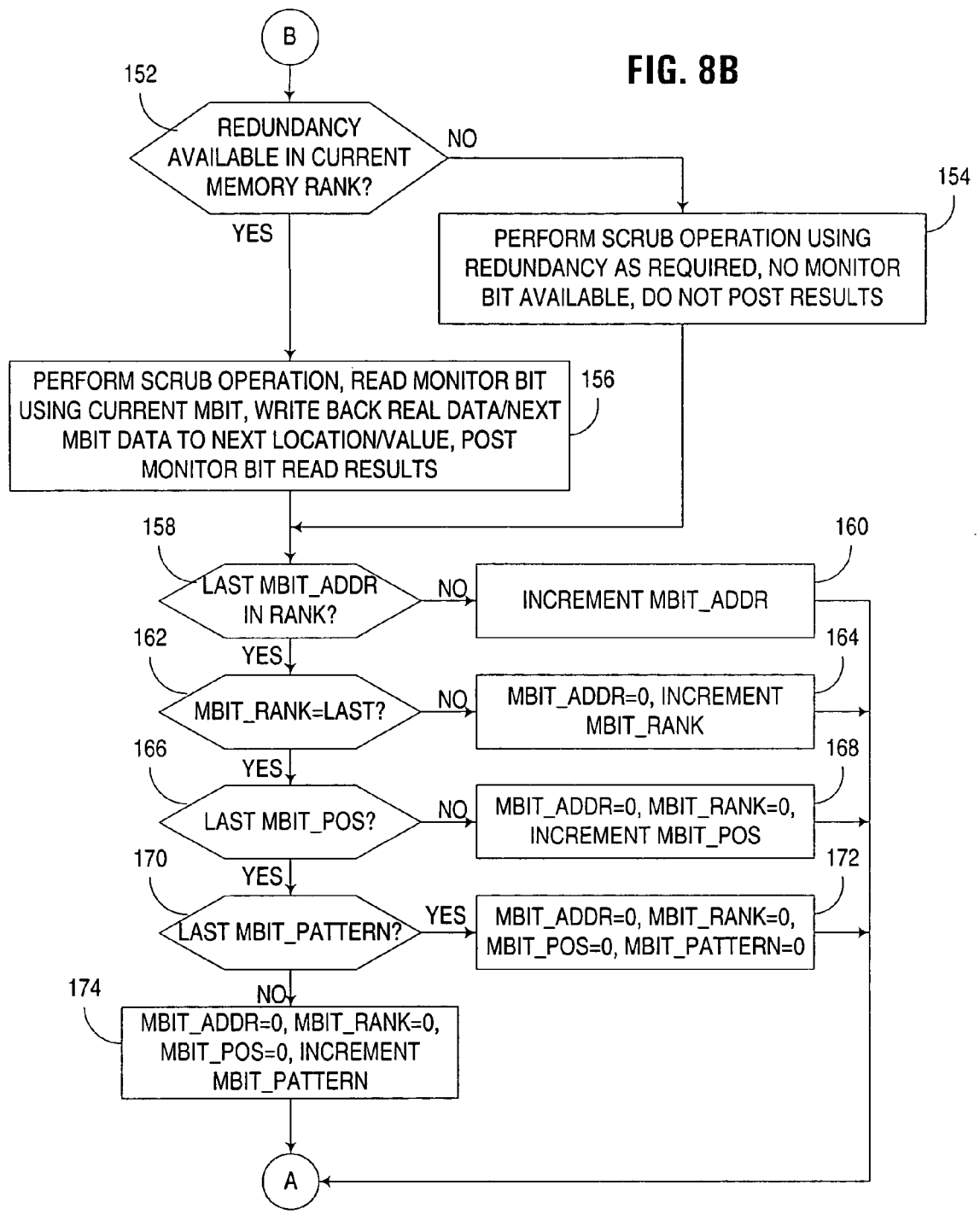
Figure 8C:
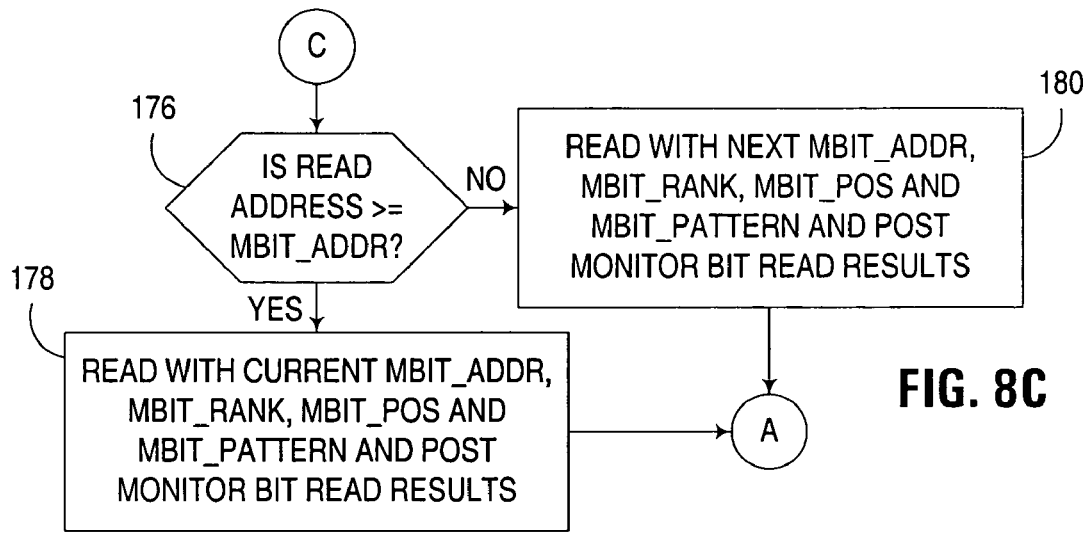
Figure 8D:
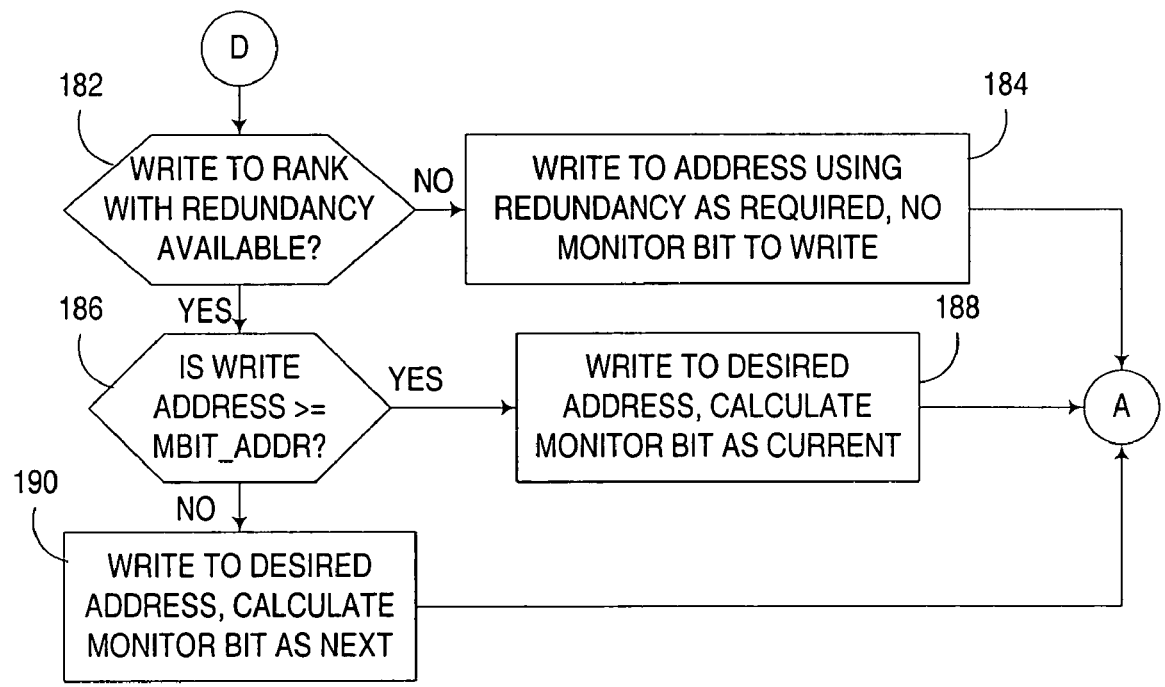

As shown in FIG. 8A, at power up of the computer system, control first passes to block 130 to initialize the DRAM devices to accept reads/writes, begin refresh, etc., in a manner known in the art. Next, block 132 invokes redundant bit steering (RBS) on all memory ranks where needed (typically using information read at power-up from previous system operation, and stored in non-volatile memory). Next, block 134 initializes all memory to 0's, including all unused redundant devices, and block 136 initializes the MBIT indicator fields, MBIT_ADDR, MBIT_RANK, MBIT_POS and MBIT_PATTERN to zero.

Next, block 138 determines whether any memory ranks have redundant memory available, i.e., whether any rank is not currently using RBS. If not, control passes to block 140, to post this status and continue normal operation with redundancy enabled, as monitoring is not available in this circumstance.

If, on the other hand, any rank has available unused redundant memory, block 138 passes control to block 142 to begin normal system read/write operations. It also may be desirable to turn the monitor function on if not already initialized as such at this point.

Next, for each received command, a series of blocks 144–148 are used to decide how to handle the command in an appropriate manner. Block 144 first determines whether the command is a scrub or monitor command. If not, control passes to block 146 to determine whether the command is a read command to a physical rank of memory where redundancy is available. If not, control passes to block 148 to determine whether the command is a write command. If not (meaning the command is a read command directed to a rank of memory without available redundancy (i.e., the redundant device is already logically swapped with a defective device), control passes to block 150 to perform a normal read operation using redundancy. No monitor function is available for this command. Once the operation is complete, control then returns to block 138 to check whether any ranks of memory have available redundancy, and assuming that is the case, to process additional received commands.

Returning to block 144, if it is determined that a command is a scrub or monitor command, block 144 passes control to block 152 (FIG. 8B), which determines whether redundancy is available in the current MBIT_RANK. If not, control passes to block 154 to perform the scrub or monitor operation using redundancy as required. Also, given the redundant device is used for this rank, no monitor bit is available, so there is no need to post any results.

On the other hand, if block 152 determines that redundancy is available, control passes to block 156 to perform the scrub or monitor operation. In connection with this operation, the current monitor bit (using the current MBIT values) is read along with the real data. Furthermore, the real data is written back, along with writing back the next monitor bit for that location (i.e., the next MBIT values for that location after the data position and/or data pattern for the MBIT indicator are incremented as needed). The results of the read of the monitor bit are also posted, either only for detected errors, or for all results, regardless of outcome. Posting of the results may also include additional information about errors, e.g., the device and/or location associated with the error, the data position and/or data pattern in effect when the error was encountered, etc.

Irrespective of whether the scrub or monitor operation is performed by block 154 or block 156, control passes to blocks 158–174 to increment the MBIT indicator, prior to returning control to block 138 of FIG. 8A. In the illustrated embodiment, the monitor process first increments MBIT_ADDR, then increments MBIT_RANK when MBIT_ADDR wraps, then increments MBIT_POS when MBIT_RANK wraps, and finally increments MBIT_PATTERN when MBIT_POS wraps. Incrementing address first and rank second is consistent with conventional memory systems incorporating scrubbing and redundant bit steering. It will be appreciated, however, that other incrementing orders may be used in other embodiments.

Specifically, block 158 determines whether MBIT_ADDR points to the last address in the current MBIT_RANK. If not, control passes to block 160 to simply increment MBIT_ADDR. Otherwise, control passes to block 162 to determine whether MBIT_RANK points to the last rank of memory.

If MBIT_RANK does not point to the last rank of memory, control passes to block 164 to wrap MBIT_ADDR back to zero and increment MBIT_RANK. Otherwise, control passes to block 166 to determine whether MBIT_POS points to the last data position in the set of data positions.

If MBIT_POS does not point to the last data position, control passes to block 168 to wrap MBIT_ADDR and MBIT_RANK back to zero and increment MBIT_POS. Otherwise, control passes to block 170 to determine whether MBIT_PATTERN points to the last data pattern in the set of data patterns.

If MBIT_PATTERN does point to the last data pattern, control passes to block 172 to wrap each of MBIT_ADDR, MBIT_RANK, MBIT_POS, and MBIT_PATTERN back to zero. Otherwise, control passes to block 174 to wrap MBIT_ADDR, MBIT_RANK and MBIT_POS back to zero and increment MBIT_PATTERN.

Returning now to block 146 (FIG. 8A), if it is determined that a command is a read command to a rank with redundancy available, block 146 passes control to block 176 (FIG. 8C), which determines whether the read address and rank associated with the command are greater than or equal to MBIT_ADDR and MBIT_RANK, the address and rank of the current MBIT indicator. If so, control passes to block 178 to perform the read operation. In addition, through control over the bit steering in the read data path, the monitor bit is also read from the appropriate device in conjunction with this operation. The position of the monitor bit (i.e., the DRAM within which the monitor bit is stored) for this operation is determined using the current values for the MBIT indicator, and once the monitor bit is read, it is compared to the expected result based upon the current MBIT indicator values. In addition, the result of the monitor bit read is posted, either for all results, or only when an error is detected. Control then returns to block 138 (FIG. 8A).

On the other hand, if the read address and rank are not greater than or equal to MBIT_ADDR and MBIT_RANK, control passes to block 180 to perform the read operation, but using the next MBIT indicator values (i.e., the values after incrementing the MBIT indicator in the manner described above in connection with blocks 158–174) to retrieve the monitor bit. As with block 178, the retrieved monitor bit is compared to its expected result, with the result posted to the system. Control then returns to block 138 (FIG. 8A).

Returning now to block 148 (FIG. 8A), if it is determined that a command is a write command, block 148 passes control to block 182 (FIG. 8D) to determine whether the write is to a rank with redundancy available. If not, control passes to block 184 to write to the address using redundancy as required. No monitor bit need be written, as the monitor function is not available for that rank. If, however, redundancy is available, control passes to block 186 to determine whether the write address and rank associated with the command is greater than or equal to MBIT_ADDR and MBIT_RANK, the address and rank of the current MBIT indicator. If so, control passes to block 188 to perform the write operation. In addition, through control over the bit steering in the write data path, the monitor bit is also written to the appropriate device in conjunction with this operation. The position of the monitor bit for this operation, and the appropriate value to write for the current data pattern, is determined using the current values for the MBIT indicator. On the other hand, if the write address and rank are not greater than or equal to MBIT_ADDR and MBIT_RANK, control passes to block 190 to perform the write operation, but using the next MBIT indicator values (i.e., the values after incrementing the MBIT indicator in the manner described above in connection with blocks 158–174) to store the appropriate value at the appropriate position for the monitor bit. Upon completion of each of blocks 184, 188 and 190, control then returns to block 138 (FIG. 8A).

With the aforementioned embodiment, the active monitoring function would typically operate in the following manner. With N ranks of memory, the monitoring/scrubbing process would march through memory starting with rank 0 and ending with rank N–1, proceeding through each memory address in each rank. When completed, the process would begin all over again. When the monitor function is enabled, typically the write back to memory after each scrub command would be enabled by default (as opposed to conventional scrub operations which typically write back corrected data when incorrect data is read during the operation). The write back is also typically required for doing a redundancy steering operation.

Further, in this embodiment, it may be desirable to set the default data position (MBIT_POS=0) to a mapping where all monitor bits are in the redundant device, and the default data pattern (MBIT_PATTERN=0) to all 0's. The second data position (MBIT_POS=1) may be set to map a small portion of each active memory device beginning with D0 for address locations X/Y to the nearest binary boundary (8, 16. 32. 64, 128, etc.) that is smaller. For example, if the address range was 1048576 (1 million binary) and the data width was 71 bits, a value of 1048576/128 or 8192 would result. As a result, address 0–8191 could be mapped to the redundant device for D0, address 8192–16383 could be mapped to the redundant device for D1, and so on. This can leave some unused amount of memory in the redundant device as monitor bits that will not be distributed to the active devices using this approach (addresses after each device has had one range replaced). Alternately, the replacement scheme can wrap on the data bits such that starting with D0 and going until the entire address range is exhausted, a second stripe of memory can be replaced (in this case going from D0 up until all addresses are used). This binary boundary example is not required but is convenient.

Given the flowchart of FIGS. 8A–8D, it is necessary for the next data position (MBIT_POS=2) to be consistent with the starting default description as noted above, with all monitor bits being located in the redundant device. The reason for this is that the above-described architecture does not include paths to move monitor bits directly from one active device to another. Rather they can only be moved to or from the redundant device. As such, before moving monitor bits around, they must first be moved back to the redundant device. With this in mind every even numbered position is all monitor bits located in the redundant device. It is further contemplated that the next data position (MBIT_POS=3) would have D1 replaced for monitor bits on addresses 0–8191, D2 replaced for monitor bits on addresses 8192–16383, and so on. Implementation of pathways to directly move monitor bits between active devices, which would eliminate the need to include the default data position every other position, would be within the abilities of one of ordinary skill in the art having the benefit of the instant disclosure.

In the exemplary embodiment, the original data pattern is marched through all different data positions in all ranks of memory where redundancy exists unused for this function. When complete, the data pattern itself is incremented to the next pattern, and the process is restarted for that pattern. When the last pattern is tested, it too wraps back to an initial value along with all the other MBIT values and the process simply loops and so runs continuously.

In ranks of memory where all redundancy has been used, no monitor function is available, used, or expected. In ranks of memory where only part of the redundancy has been used, the remaining unused portion may still be used as monitor bits in some embodiments. In such instances, the address range may be compressed and/or offset from 0, which although adding complexity, is still contemplated by the invention.

In situations where an ECC error has been detected during active monitoring and redundancy is required for a particular rank, it may be desirable to perform the following operations:

(1) If the rank of memory with the need for redundancy to be invoked is being updated by the monitor function, turn on fast scrub to complete the operation on the rank of memory quickly.

(2) If the monitor bits are in the redundant device only, proceed to invoke redundancy repair/replacement with fast scrub. Turn the redundancy bit on for this rank of memory (assuming all bits were used), and disable the monitor function for this rank of memory.

(3) If the monitor bits are in one or more active devices, run fast scrub on this rank of memory and move the real data from the redundant device back to the active device(s). Proceed to invoke redundancy repair/replacement with fast scrub. Turn the redundancy bit on for this rank of memory (assuming all bits were used), and disable the monitor function for this rank of memory.

In other embodiments, the data positions shown could be simplified to map entire address ranges for individual active devices to a redundant device (e.g., to implement the functionality described in connection with FIG. 2). In such a scheme, a data position set could be defined that started with all of the monitor bits in the redundant device (designated here as "R"), with mappings to each of the Y devices provided with mappings back to the redundant device interleaved therewith, e.g.: R, D0, R, D1, R, D2, R, D3, R, D4, etc.

It will also be noted that in the exemplary embodiment, the monitor bits are read during normal read operations, and written during normal write operations (where "normal" in this context refers to the regular memory accesses requested by the computer, which are not specifically issued to handle monitor or scrub operations, i.e., the normal data traffic for the memory system). In other embodiments, monitor bits may only be read from or written to during scrub/monitor operations. It will be appreciated that it may still be necessary in such embodiments to write the monitor bits in connection with normal write operations.

The monitor result data generated as a result of active monitoring may be utilized in a number of manners consistent with the invention. For example, the results may be analyzed by the operating system of the computer, dedicated hardware and/or software in the memory controller, a dedicated application, or even a systems administrator to identify potential problem areas. Based upon the analysis, various corrective actions may be made, e.g., swapping out a device if repeated errors are detected on that device, changing operating parameters in the system to reduce stress on the memory system (e.g., by lowering speed, performance or workload, changing operating voltage, changing cooling parameters, etc.), or even shutting down the system. In addition, results may simply be made available for later manual analysis.

As such, it will be appreciated that the exemplary embodiment enables active monitoring to be performed with little or no additional overhead, as well as little or no additional hardware components. Much of the monitoring functionality takes advantage of otherwise unused resources, and relies upon normal read/write traffic and scrub operations. Consequently, the embodiment enhances the monitoring capability of a computer system in an extremely cost effective manner that may be applied to many environments, including those that are cost and/or performance limited.

It will be appreciated that various additional modifications may be made to the illustrated embodiments consistent with the invention. It will also be appreciated that implementation of the functionality described above in one or more integrated circuits would be well within the abilities of one of ordinary skill in the art having the benefit of the instant disclosure.

What is claimed is:

1. A method of testing a solid state memory device, the method comprising:
    dynamically transitioning a memory address range allocated to an active solid state memory device from the active solid state memory device to a redundant solid state memory device such that memory accesses associated with the memory address range are directed to the redundant solid state memory device; and
    testing the active solid state memory device while memory accesses associated with the memory address range are directed to the redundant solid state memory device.

2. The method of claim 1, further comprising, after testing the active solid state memory device, dynamically transitioning the memory address range allocated to the active solid state memory device from the redundant solid state memory device to the active solid state memory device such that memory accesses associated with the memory address range are directed to the active solid state memory device.

3. The method of claim 1, wherein dynamically transitioning the memory address range from the active solid state memory device to the redundant solid state memory device includes copying data stored in the active solid state memory device to the redundant solid state memory device.

4. The method of claim 1, wherein the memory range comprises all of the memory addresses allocated to the active solid state memory device.

5. The method of claim 1, wherein the memory range comprises a portion of the memory addresses allocated to the active solid state memory device.

6. The method of claim 5, further comprising:
    dynamically transitioning a second memory address range allocated to a second active solid state memory device from the second active solid state memory device to the redundant solid state memory device such that memory accesses associated with the second memory address range are directed to the redundant solid state memory device; and
    testing the second active solid state memory device while memory accesses associated with the first and second memory address ranges are directed to the redundant solid state memory device.

7. The method of claim 6, wherein the first and second active solid state memory devices are among a plurality of active solid state memory devices in a memory subsystem, the method further comprising:
    dynamically transitioning a memory address range allocated to each active solid state memory device in the memory subsystem from such active solid state memory device to the redundant solid state memory device; and
    testing each of the active solid state memory devices while memory accesses associated with each memory address range is directed to the redundant solid state memory device.

8. The method of claim 1, wherein testing the active solid state memory device comprises writing a test pattern to the active solid state memory device and reading data from the active solid state memory device to determine whether the data matches the written test pattern.

9. The method of claim 1, wherein the active solid state memory device and the redundant memory device are among a plurality of solid state memory devices disposed in a rank of the memory subsystem, and wherein each of the plurality of solid state memory devices are configured to be accessed in parallel to read or write a plurality of bits addressed at a memory address, wherein dynamically transitioning the memory address range allocated to the active solid state memory device to the redundant solid state memory device comprises steering at least one bit allocated to the active solid state memory device to the redundant solid state memory device, and wherein testing the active solid state memory device comprises steering test data to and from the at least one bit allocated to the active solid state memory device.

10. The method of claim 1, wherein testing the active solid state memory device is performed at least in part using scrub commands.

11. The method of claim 10, wherein testing the active solid state memory device is additionally performed at least in part using regular read and write commands processed while memory accesses associated with the memory address range are directed to the redundant solid state memory device.

12. A method of testing a plurality of solid state memory devices in a memory subsystem, the method comprising:
    for each of a plurality of active solid state memory devices in a memory subsystem, dynamically transitioning a memory address range allocated to such active solid state memory device from such active solid state memory device to at least one redundant solid state memory device such that memory accesses associated with such memory address range are directed to the at least one redundant solid state memory device; and testing the plurality of active solid state memory devices while memory accesses associated with each memory address range are directed to the at least one redundant solid state memory device.

13. A circuit arrangement comprising:
a memory interface configured to be coupled to at least one active solid state memory device and at least one redundant solid state memory device; and
logic circuitry coupled to the memory interface and configured to test the active solid state memory device by dynamically transitioning a memory address range allocated to the active solid state memory device from the active solid state memory device to the redundant solid state memory device such that memory accesses associated with the memory address range are directed to the redundant solid state memory device, and testing the active solid state memory device while memory accesses associated with the memory address range are directed to the redundant solid state memory device.

14. The circuit arrangement of claim 13, wherein the logic circuitry is further configured to, after testing the active solid state memory device, dynamically transition the memory address range allocated to the active solid state memory device from the redundant solid state memory device to the active solid state memory device such that memory accesses associated with the memory address range are directed to the active solid state memory device.

15. The circuit arrangement of claim 13, wherein the logic circuitry is configured to dynamically transition the memory address range from the active solid state memory device to the redundant solid state memory device by copying data stored in the active solid state memory device to the redundant solid state memory device.

16. The circuit arrangement of claim 13, wherein the memory range comprises all of the memory addresses allocated to the active solid state memory device.

17. The circuit arrangement of claim 13, wherein the memory range comprises a portion of the memory addresses allocated to the active solid state memory device.

18. The circuit arrangement of claim 17, wherein the logic circuitry is further configured to dynamically transition a second memory address range allocated to a second active solid state memory device from the second active solid state memory device to the redundant solid state memory device such that memory accesses associated with the second memory address range are directed to the redundant solid state memory device, and to test the second active solid state memory device while memory accesses associated with the first and second memory address ranges are directed to the redundant solid state memory device.

19. The circuit arrangement of claim 18, wherein the first and second active solid state memory devices are among a plurality of active solid state memory devices coupled to the memory interface, wherein the logic circuitry is further configured to dynamically transition a memory address range allocated to each active solid state memory device from such active solid state memory device to the redundant solid state memory device, and to test each of the active solid state memory devices while memory accesses associated with each memory address range is directed to the redundant solid state memory device.

20. The circuit arrangement of claim 13, wherein the logic circuitry is configured to test the active solid state memory device by writing a test pattern to the active solid state memory device and reading data from the active solid state memory device to determine whether the data matches the written test pattern.

21. The circuit arrangement of claim 13, wherein the active solid state memory device and the redundant memory device are among a plurality of solid state memory devices disposed in a rank of the memory subsystem, and wherein each of the plurality of solid state memory devices are configured to be accessed in parallel to read or write a plurality of bits addressed at a memory address, wherein the logic circuitry comprises bit steering logic configured to dynamically transition the memory address range allocated to the active solid state memory device to the redundant solid state memory device by steering at least one bit allocated to the active solid state memory device to the redundant solid state memory device, and to test the active solid state memory device by steering test data to and from the at least one bit allocated to the active solid state memory device.

22. The circuit arrangement of claim 13, wherein the logic circuitry is configured to test the active solid state memory device at least in part using scrub commands.

23. The circuit arrangement of claim 22, wherein the logic circuitry is configured to test the active solid state memory device additionally using regular read and write commands processed while memory accesses associated with the memory address range are directed to the redundant solid state memory device.

24. The circuit arrangement of claim 13, wherein at least a portion of the logic circuitry is disposed in a memory controller.

25. An apparatus comprising the circuit arrangement of claim 13 and a plurality of solid state memory devices coupled to the memory interface.

26. An integrated circuit device comprising the circuit arrangement of claim 13.

27. A program product, comprising a hardware definition program that defines the circuit arrangement of claim 13; and a computer readable signal bearing medium bearing the hardware definition program, wherein the signal bearing medium includes at least one of a transmission type media and a recordable media.

* * * * *

UNITED STATES PATENT AND TRADEMARK OFFICE
CERTIFICATE OF CORRECTION

| | |
|---|---|
| PATENT NO. | : 7,185,246 B2 |
| APPLICATION NO. | : 11/013150 |
| DATED | : February 27, 2007 |
| INVENTOR(S) | : William Hugh Cochran and William Paul Hovis |

It is certified that error appears in the above-identified patent and that said Letters Patent is hereby corrected as shown below:

Title Page, Col. 2, Line (74), "Heron" should be --Herron--.

Signed and Sealed this

Seventeenth Day of April, 2007

JON W. DUDAS
*Director of the United States Patent and Trademark Office*